(12) United States Patent
Jeong et al.

(10) Patent No.: US 11,189,332 B2
(45) Date of Patent: Nov. 30, 2021

(54) VOLTAGE CONTROLLER AND MEMORY DEVICE INCLUDING SAME

(71) Applicant: SAMSUNG ELECTRONICS CO., LTD., Suwon-si (KR)

(72) Inventors: Jaewoo Jeong, Suwon-si (KR); Byongmo Moon, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 16/842,891

(22) Filed: Apr. 8, 2020

(65) Prior Publication Data

US 2021/0110860 A1 Apr. 15, 2021

(30) Foreign Application Priority Data

Oct. 11, 2019 (KR) .................... 10-2019-0126400

(51) Int. Cl.
| | | |
|---|---|---|
| *G11C 11/4074* | (2006.01) | |
| *G11C 11/4076* | (2006.01) | |
| *G11C 11/4094* | (2006.01) | |
| *G11C 29/12* | (2006.01) | |
| *G11C 11/4091* | (2006.01) | |

(52) U.S. Cl.
CPC ...... *G11C 11/4074* (2013.01); *G11C 11/4076* (2013.01); *G11C 11/4091* (2013.01); *G11C 11/4094* (2013.01); *G11C 29/12005* (2013.01); *G11C 2029/1204* (2013.01)

(58) Field of Classification Search
CPC ............ G11C 11/4074; G11C 11/4076; G11C 11/4094; G11C 29/12005
See application file for complete search history.

(56) References Cited

U.S. PATENT DOCUMENTS

| | | | |
|---|---|---|---|
| 7,432,731 B2 | 10/2008 | Bains et al. | |
| 9,461,647 B2 | 10/2016 | Chung et al. | |
| 2008/0219068 A1 | 9/2008 | Kim et al. | |
| 2010/0110768 A1* | 5/2010 | Choi .................... | G11C 13/004 365/148 |
| 2017/0062050 A1 | 3/2017 | Baek et al. | |
| 2017/0315572 A1 | 11/2017 | Ikeda | |
| 2018/0375692 A1* | 12/2018 | Wieduwilt .......... | G11C 11/4076 |
| 2019/0080783 A1 | 3/2019 | Kim et al. | |
| 2019/0096446 A1* | 3/2019 | Lee .......................... | G11C 7/12 |
| 2019/0172519 A1 | 6/2019 | Lee et al. | |

FOREIGN PATENT DOCUMENTS

KR 10-2019-003619 A 4/2019

* cited by examiner

*Primary Examiner* — Tuan T Nguyen
(74) *Attorney, Agent, or Firm* — Volentine, Whitt & Francos, PLLC

(57) ABSTRACT

A memory device includes a memory cell array including a plurality of memory cells storing data, a sense amplifier connected to the memory cell array, and a voltage controller. The voltage controller includes a voltage driver that generates a control signal and an overdrive controller that generates an overdrive control signal that regulates the generating of the control signal in response to at least one of a result of a comparison between the control signal and a reference voltage, and process, voltage, temperature (PVT) information. The voltage driver adjusts the control signal in response to the overdrive control signal to generate an overdriven control signal and outputs the overdriven control signal to the sense amplifier.

20 Claims, 11 Drawing Sheets

MAP1

| ZQ code | level | output timing |
|---|---|---|
| REF1 | − | − |
| ~ REF1±1 | +1 | $-0.1 \times T_{CLK}$ |
| ~ REF1±2 | +2 | $-0.2 \times T_{CLK}$ |
| ~ REF1±3 | +3 | $-0.3 \times T_{CLK}$ |
| ~ REF1±4 | +4 | $-0.4 \times T_{CLK}$ |
| ~ REF1±5 | +5 | $-0.5 \times T_{CLK}$ |
| ⋮ | ⋮ | ⋮ |
| ~ REF1±n | +n | $-0.1 \times n \times T_{CLK}$ |

MAP2

| DQS timing(l) | level | output timing |
|---|---|---|
| REF2 | − | − |
| ~ REF2±1 | +0.5 | −0.1×$T_{CLK}$ |
| ~ REF2±2 | +1 | −0.2×$T_{CLK}$ |
| ~ REF2±3 | +1.5 | −0.3×$T_{CLK}$ |
| ~ REF2±4 | +2 | −0.4×$T_{CLK}$ |
| ~ REF2±5 | +2.5 | −0.5×$T_{CLK}$ |
| ⋮ | ⋮ | ⋮ |
| ~ REF2±n | +0.5×n | −0.1×n×$T_{CLK}$ |

VOLTAGE CONTROLLER AND MEMORY DEVICE INCLUDING SAME

CROSS-REFERENCE TO RELATED APPLICATION

This application claims priority to Korean Patent Application No. 10-2019-0126400 filed on Oct. 11, 2019 in the Korean Intellectual Property Office, the subject matter of which is hereby incorporated by reference in its entirety.

BACKGROUND

1. Field

The inventive concept relates generally to voltage controller(s) and memory device(s) including voltage controller(s).

2. Description of Related Art

Memory devices perform a variety of operations including a write operation, a read operation, an erase operation, housekeeping operation(s), etc. Operations are executed and controlled using, at least in part, a number of control voltages. There are many different types of control signal, and some control signals vary in nature according to the mode or other operating characteristics of the memory device. For example, some memory devices may overdrive one or more control voltages before applying the overdriven control voltage(s) to a memory cell array in order to maintain a desired level for the control voltage(s). In this manner the control voltages(s) may be level-maintained in a target range or at a target level.

In this regard, the control voltage(s) may be affected by (or undesirably vary) in response to variations in process and temperature conditions, as well as in response to variations in the level of one or more externally provided power supply voltage(s). Accordingly, in order to stably operate a memory device, it is necessary to control the control voltage(s) in consideration of the process, voltage, and temperature (PVT) conditions.

SUMMARY

One aspect of the inventive concept provides a memory device more stably operated by controlling certain control voltage(s) in consideration of PVT conditions. Another aspect of the inventive concept uses PVT information to control certain control voltage(s) during operation of the memory device.

In one aspect, the inventive concept provides a memory device, including; a memory cell array including a plurality of memory cells storing data, a sense amplifier connected to the memory cell array, and a voltage controller. The voltage controller includes a voltage driver that generates a control signal, and an overdrive controller that generates an overdrive control signal that regulates the generating of the control signal in response to at least one of a result of a comparison between the control signal and a reference voltage, and process, voltage, temperature (PVT) information. The voltage driver adjusts the control signal in response to the overdrive control signal to generate an overdriven control signal and outputs the overdriven control signal to the sense amplifier.

In another aspect, the inventive concept provides a memory device, including; a plurality of memory cells disposed at intersections of a plurality of word lines and a plurality of bitlines, a sense amplifier connected to the plurality of bitlines and sense amplifying data stored in the plurality of memory cells, an input and output circuit exchanging the data through a plurality of data lines using a data signal (DQ) and a data strobe signal (DQS), and a voltage controller providing a control voltage to at least one of the plurality of memory cells and the sense amplifier. The voltage controller includes; a voltage driver that generates the control voltage, a first overdrive controller that generates a first overdrive control signal applied to the voltage controller to regulate generation of the control voltage in response to a change in an externally provided power supply voltage, and a second overdrive controller that generates a second overdrive control signal applied to the voltage driver to regulate generation of the control voltage in response to at least one of a ZQ code that matches an ON-resistance of the input and output circuit to reference ZQ resistance, and a phase difference between the data signal (DQ) and the data strobe signal (DQS).

In another aspect, the inventive concept provides a voltage controller including; a voltage driver configured to generate a control signal used to perform a bitline sensing operation of a memory device, a first overdrive controller configured to generate a first overdrive control signal that regulates generation of the control signal in response to a result of comparing the control signal with a reference voltage, and a second overdrive controller configured to generate a second overdrive control signal that regulates generation of the control signal in response to process, voltage, temperature (PVT) information. The PVT information includes at least one of a ZQ code that matches an ON-resistance of an input and output circuit of the memory device to reference ZQ resistance, and a phase difference between a data signal (DQ) and a data strobe signal (DQS) as applied to the input and output circuit.

BRIEF DESCRIPTION OF DRAWINGS

The above and other aspects, features and other advantages of the inventive concept will be more clearly understood from the following detailed description, taken in conjunction with the accompanying drawings, in which.

DETAILED DESCRIPTION

Hereinafter, the example embodiments of the inventive concept will be described in some additional with reference to the accompanying drawings. Like reference numbers and labels denote like (or similar) elements.

Figure 1:
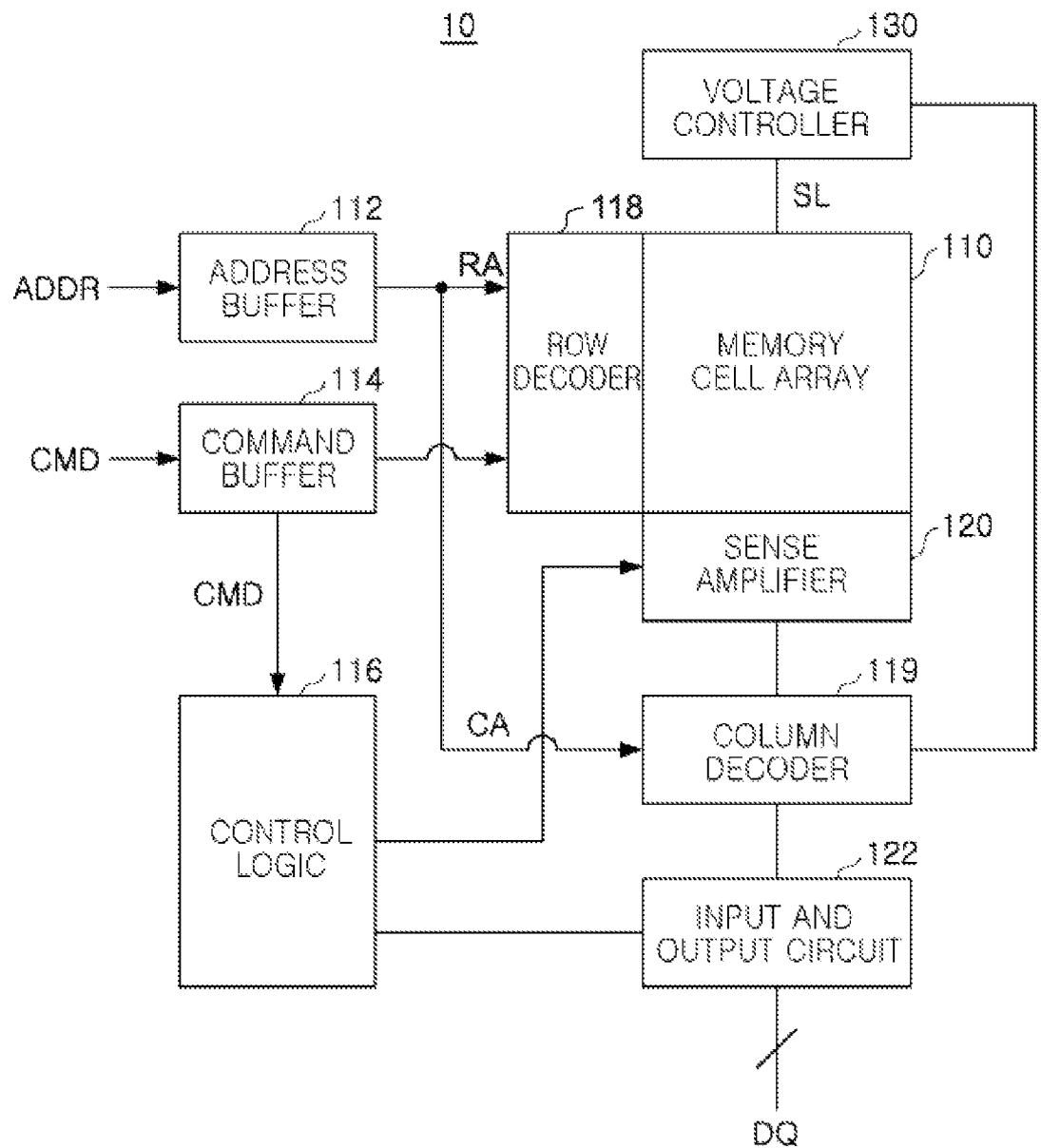
FIG. 1 is a block diagram illustrating a memory device according to an example embodiment of the inventive concept.

FIG. 1 is a block diagram illustrating a memory device 10 according to an example embodiment.

Referring to FIG. 1, the memory device 10 may output data via a plurality of data lines DQ in response to certain command CMD, address ADDR, and control signals. At least one of the command CMD, address ADDR, and control signal(s) may be externally provided from (e.g.) a central processing unit (CPU) or a memory controller).

As illustrated in FIG. 1, the memory device 10 may include a memory cell array 110, an address buffer 112, a command buffer 114, a control logic 116, a row decoder 118, a column decoder 119, a sense amplifier 120, an input and output circuit 122, and a voltage controller 130.

The memory cell array 110 may include a plurality of word lines, a plurality of column lines, and a plurality of memory cells, each respectively capable of storing data. The plurality of memory cells may be arranged at points at which the plurality of word lines and the plurality of bitlines cross (or intersect) each other. The plurality of memory cells may be provided in a matrix arrangement of rows and columns, where the plurality of word lines may be connected to rows of the plurality of memory cells, and the plurality of bitlines may be connected to columns of the plurality of memory cells.

The address buffer 112 may receive the address ADDR from the CPU or the memory controller. The address ADDR may include a row address RA addressing one or more row(s) of the memory cell array 110 and a column address CA addressing one or more column(s) of the memory cell array 110. The address buffer 112 may transmit the row address RA to the row decoder 118, and may transmit the column address CA to the column decoder 119.

The command buffer 114 may receive the command CMD from the CPU or the memory controller. The command CMD may take many different forms, including as examples an active command, a read command, a write command, a precharge command, etc. The command buffer 114 may transmit the command CMD to the control logic 116.

The control logic 116 may be used to control the overall operation of the memory device 10. For example, the control logic 116 may decode a row address strobe signal (/RAS), a column address strobe signal (/CAS), a chip select signal (/CS), and a write enable signal (/WE), received from the CPU or the memory controller, to generate control signal(s) corresponding to the command CMD.

The row decoder 118 may be used to select at least one word line of a plurality of word lines connected to the memory cell array 110 in response to the row address RA received from the address buffer 112. For example, the row decoder 118 may decode the row address RA received from the address buffer 112, and select at least one word line corresponding to the decoded row address RA.

The column decoder 119 may decode the column address CA received from the address buffer 112 and transmit the decoded column address to the sense amplifier 120.

The column decoder 119 may decode the column address CA received from the address buffer 116 and transmit the decoded column address to the sense amplifier 120.

The sense amplifier 120 may be connected to a plurality of bitlines of the memory cell array 110. The sense amplifier 120 may be used to select at least one of bitline among a plurality of bitlines connected to the memory cell array 110 in response to the column address CA received from the column decoder 119. For example, the sense amplifier 120 may select at least one of bitline corresponding to the column address CA received from the column decoder 119. In addition, the sense amplifier 120 may sense a voltage change of the selected bitline, and may amplify and output the sensed voltage change.

The input and output circuit 122 may be used to exchange data with the CPU or the memory controller through a plurality of data lines DQ. For example, during a write operation being performed by the memory device 10, the input and output circuit 122 may receive data from the CPU or the memory controller through the plurality of data lines DQ, and transmit the received data to the sense amplifier 120. Moreover, during a read operation being performed by the memory device 10, the input and output circuit 122 may output data corresponding to a voltage change of the bitline received from the sense amplifier 120 to the CPU or the memory controller through the data lines DQ.

The voltage controller 130 may be used to generate the control voltage(s) variously associated with respective operations of the memory device 10 using at least one externally provided power supply voltage $V_{EXT}$. The control voltage(s) may include as examples; a write voltage, a read voltage, and an array voltage $V_{INT}$ for a bitline sensing operation, etc. The voltage controller 130 may provide one or more of the control voltage(s) to the memory cell array 110 through the signal line SL. Moreover, the voltage controller 130 may provide one or more of the control voltage(s) to the sense amplifier 120.

A respective level(s) of the control voltage(s) provided to the memory cell array 110 and the sense amplifier 120 may generally be reduced during operation of the memory device 10. For example, the level of the array voltage $V_{INT}$ may be dramatically fall during an initial stage of a bitline sensing operation performed by the sense amplifier 120. Unfortunately, when the level of the array voltage $V_{INT}$ falls, the bitline sensing time may increase to a point where the operation fails. To avoid this outcome, the voltage controller 130 may overdrive the control voltage(s) to ensure that the control voltage(s) provided (or applied) to the memory cell array 110 and/or the sense amplifier 120 are maintained at a target level during the various operations performed by the memory device 10. In this context, the term "overdrive" means applying regulated voltage generation process(es) or voltage generation control process(es) that is capable of compensating for effects otherwise adversely altering one or more characteristic(s) of the control voltage(s).

However, it should be noted that the characteristic(s) (e.g., level, timing, etc.) of the control voltage(s) may be undesirably affected by process and temperature variations, as well as variations in the one or more externally provided supply voltage $V_{EXT}$. Thus, in order to prevent over-shoot of under-shoot of the control voltages, it is necessary to control the control voltage(s) in consideration of the process, voltage, and temperature (PVT) conditions. In this regard, the voltage controller 130 according to an example embodiment of the inventive concept defines and appropriately controls an overdrive level for the control voltage(s) and/or timing of the control voltage(s) in response to on PVT information, such that the memory device 10 stably operates.

Figure 2:
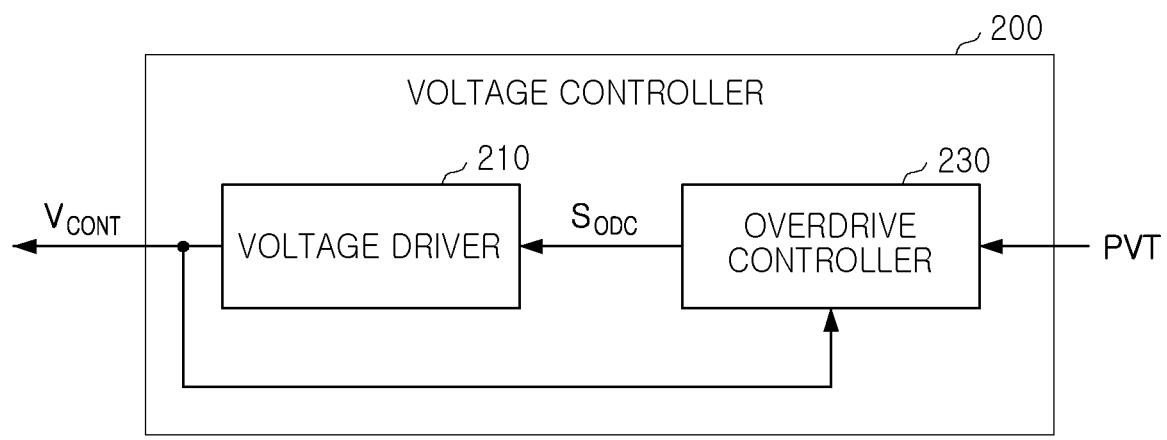
FIG. 2 is a block diagram further illustrating in one example voltage controller of a memory device according to an example embodiment of the inventive concept.
Figure 3A:
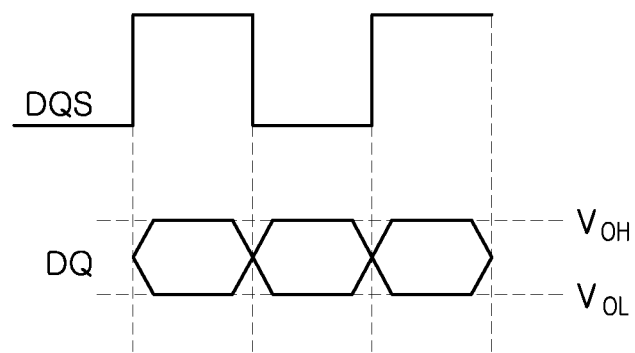
FIGS. 3A and 3B are respective signal waveform diagrams illustrating certain timing considerations for a memory device according to an example embodiment of the inventive concept.
Figure 3B:
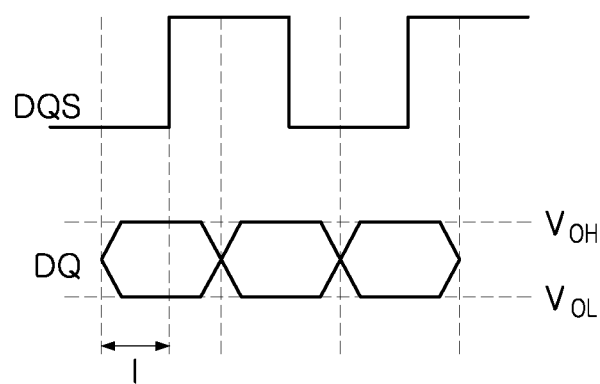

FIG. 2 is a block diagram further illustrating in one example of another voltage controller 200 of a memory device according to an example embodiment of the inventive concept. FIGS. 3A and 3B are respective signal timing diagrams illustrating exemplary DQS timing considerations.

Referring to FIGS. 1 and 2, the voltage controller 200 includes a voltage driver 210 and an overdrive controller 230.

The voltage driver 210 may be used to generate a control voltage $V_{CONT}$ required for an operation of the memory device 10 under the control of the control logic 116. The generated control voltage $V_{CONT}$ may be provided to the memory cell array 110 and/or the sense amplifier 120. In an example embodiment, the control voltage $V_{CONT}$ may include an array voltage $V_{INTA}$ used during a bitline sensing operation performed by the sense amplifier 120. The control voltage $V_{CONT}$ generated by the voltage driver 210 may also be fed back to the overdrive controller 230 as a feedback control voltage.

The overdrive controller 230 may be used to regulate the voltage driver 210 such that the voltage driver 210 provides an overdriven control voltage $V_{CONT}$. For example, the overdrive controller 230 may generate an overdrive control signal $S_{ODC}$ that may be used to regulate generation of the control voltage $V_{CONT}$ by the voltage driver 210. That is, the voltage driver 210 may adjust at least one of the level and/or the timing of the control voltage $V_{CONT}$ in response to the control signal $S_{ODC}$ received from the overdrive controller 230. As a result, the control voltage $V_{CONT}$ provided by the voltage controller 200 may be an overdriven (or overdrive adjusted) control voltage $V_{CONT}$ provided to the memory cell array 110 and/or the sense amplifier 120. Here, the timing (e.g., the output timing) of the control voltage $V_{CONT}$ may refer to the timing with which the control voltage $V_{CONT}$ is applied to the memory cell array 110 and/or the sense amplifier 120.

In an example embodiment, the overdrive controller 230 may generate the overdrive control signal $S_{ODC}$ which is used to regulate the level of the control voltage $V_{CONT}$ in response to a comparison result derived by comparing the feedback control voltage $V_{CONT}$ received from the voltage driver 210 with a reference voltage. For example, the overdrive controller 230 may generate the overdrive control signal $S_{ODC}$ for regulating the level of a control voltage $V_{CONT}$, such that the level of the feedback control voltage $V_{CONT}$ received from the voltage driver 210 is equal to a level of the reference voltage.

In an example embodiment, the overdrive controller 230 may generate an overdrive control signal $S_{ODC}$ for regulating at least one of the level of the control voltage $V_{CONT}$ and/or the timing of the control voltage $V_{CONT}$, in response to process, voltage and/or temperature information (hereafter, generally "PVT information"). For example, when the operating temperature of the memory device 10 increases, the overdrive controller 230 may generate an overdrive control signal $S_{ODC}$ that causes an increase in the level of the control voltage $V_{CONT}$ by a value and/or advancing the output timing of the control voltage $V_{CONT}$.

In some examples, the PVT information may include a ZQ code and DQS timing information. Here, the ZQ code may be a binarized correction value used to match the ON-resistance Ron of the input and output circuit 122 with the ZQ resistance connected to the ZQ pad. The DQS timing information may be a phase difference between a data signal DQ and a data strobe signal DQS. For example, when the memory device 10 performs a read operation, the data signal DQ and the data strobe signal DQS may be output from the input and output circuit 122 with a same phase, as illustrated in FIG. 3A.

However, when the memory device 10 performs a write operation, the data strobe signal DQS may be applied through a buffer. Thus, as illustrated in FIG. 3B, the data strobe signal DQS may be delayed in relation to the data signal DQ as applied to the input and output circuit 122. Moreover, this phase difference between the data signal DQ and the data strobe signal DQS may vary according to change(s) in the PVT conditions. Thus, the overdrive controller 230 may be used to adjust at least one of the level and the timing of the control voltage $V_{CONT}$ in response to changes in a phase difference between the data signal DQ and the data strobe signal DQS. In this manner, the memory device 10 may be more stable operated.

The data signal DQ may be a signal having an alternating (or AC) swing between an output high level voltage $V_{OH}$ (hereafter a "high") and an output low level voltage $V_{OL}$ (hereafter, a "low"), as comparatively illustrated in FIGS. 3A and 3B, according to data stored in a memory cell.

Since a reference voltage used to determine the state of the data (e.g., '1' or '0') stored in a memory cell is determined using $V_{OH}$ and $V_{OL}$ of the data signal DQ, it is important that $V_{OH}$ and $V_{OL}$ are maintained to be constant in order to improve reliability of the data. However, depending to the PVT conditions, the ON-resistance Ron of the input and output circuit 122 may vary, and thus, $V_{OH}$ of the data signal DQ may also vary. In order to prevent this outcome using a ZQ code, a ZQ calibration operation may be performed that matches the ON-resistance Ron of the input and output circuit 122 to a ZQ resistance.

Figures 4, 5A:
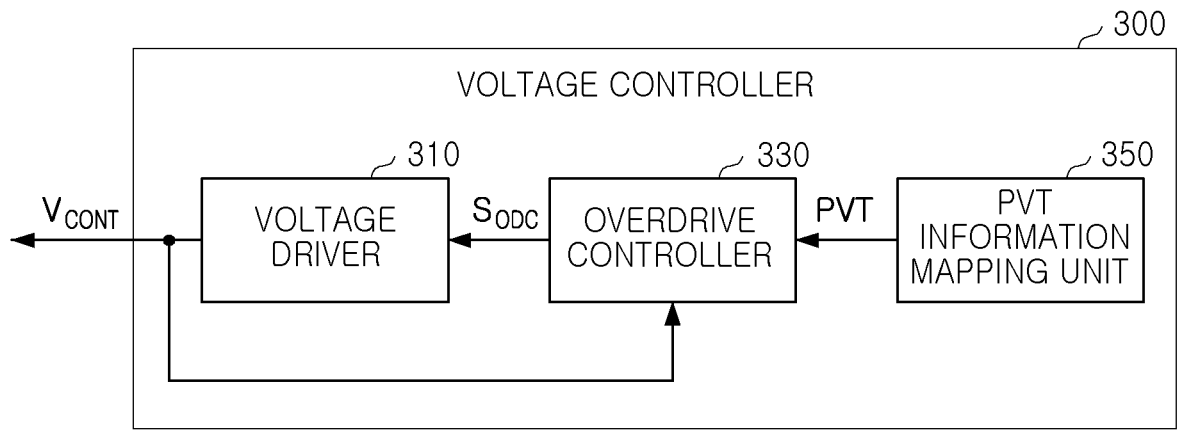
FIG. 4 is a block diagram further illustrating in another example a voltage controller of a memory device according to an example embodiment of the inventive concept.
FIGS. 5A and 5B are respective charts listing exemplary mapping tables that may be stored in relation to the voltage controller of FIG. 4.
Figures 5B, 6A:
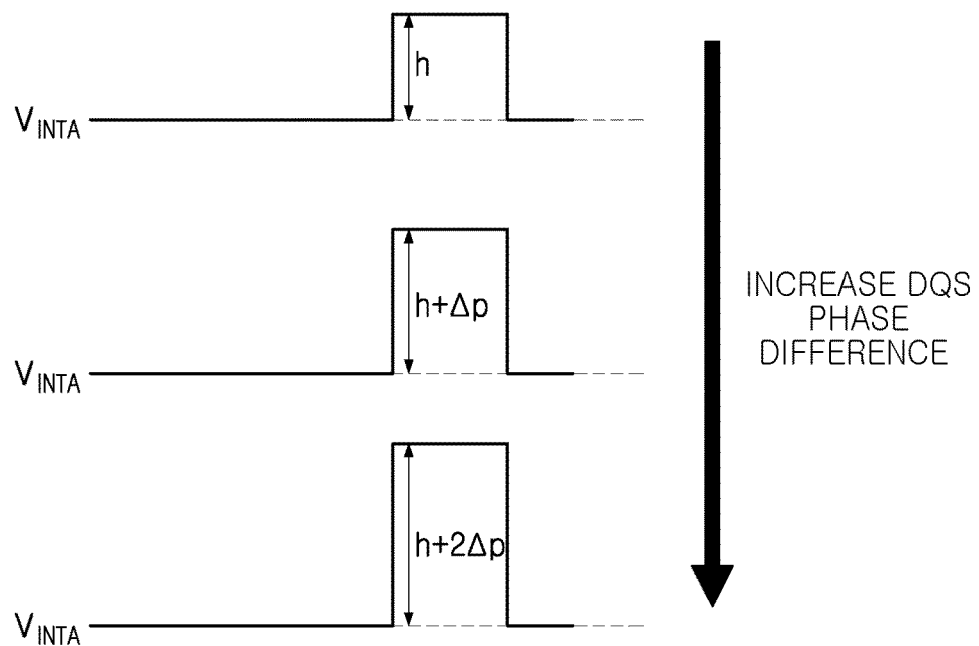
FIGS. 6A, 6B and 6C are respective signal diagrams illustrating a method of adjusting a control voltage in response to PVT information.

FIG. 4 is a block diagram further illustrating in one example still another voltage controller 300 of a memory device according to an example embodiment of the inventive concept. FIGS. 5A and 5B are respective charts listing examples of a mapping table that may be stored in relation to the voltage controller 300 of FIG. 4.

Referring to FIGS. 1, 2 and 4, the voltage controller 300 may include a voltage driver 310, an overdrive controller 330, and a PVT information mapping unit 350.

Here again, the voltage driver 310 may be used to generate a control voltage WONT required for an operation of the memory device 10 under the control of the control logic 116. For example, the generated control voltage $V_{CONT}$ may be applied to the memory cell array 110 and/or the sense amplifier 120. The control voltage $V_{CONT}$ may also be fed back to the overdrive controller 330.

The overdrive controller 330 may control the voltage driver 310, such that the voltage driver 310 may generate an overdriven control voltage $V_{CONT}$. For example, as previously described in relation to FIG. 2, the overdrive controller 330 may generate an overdrive control signal $S_{ODC}$ that regulates generation of the control voltage $V_{CONT}$ by the voltage driver 310. That is, the voltage driver 310 may adjust at least one of the level and/or the timing of the control voltage $V_{CONT}$ in response to the overdrive control signal $S_{ODC}$ received from the overdrive controller 330. Thereafter, the adjusted (or overdriven) control voltage $V_{CONT}$ may be applied to the memory cell array 110 and/or the sense amplifier 120.

In an example embodiment of FIG. 3, the overdrive controller 330 may generate the overdrive control signal $S_{ODC}$ in response to at least one of a comparison result derived by comparing the feedback control voltage $V_{CONT}$ with a reference voltage and the PVT information. In some examples, the PVT information may include a ZQ code and/or DQS timing information.

The PVT information mapping unit 350 may provide mapping information between PVT information and one or more characteristics (e.g., level and/or timing) of the control voltage $V_{CONT}$ to the overdrive controller 330. For example, the PVT information mapping unit 350 may map one or more change(s) in one or more of the PVT conditions with various control values associated with the one or more control voltage $V_{CONT}$ characteristics. The resulting control values may be provided to the overdrive controller 330. In an example embodiment, the PVT information mapping unit 350 may be provided in the form of a mapping table, as illustrated in FIGS. 5A and 5B.

Referring to FIG. 5A, the PVT information mapping unit 350 of FIG. 4 may include a first mapping table MAP1 storing a ZQ code and mapping information between a level of the control voltage $V_{CONT}$ and the output timing control value. The first mapping table MAP1 may store a first reference value REF obtained using a design tool (e.g., P-SPICE), and may store various levels for the a control voltage $V_{CONT}$ as well as output timing control values in relation to different ZQ codes.

In FIG. 5A, the different ZQ codes may be determined in relation to the first reference value REF1 (e.g., the first reference value, plus or minus a defined number of increment(s) 'n', or REF1+/−n). The level control values may be determined according to a linearly incrementing (or stepped) scale ranging from a reference level '0' through 'n' increments), and the output timing control values may be determined according to a sequentially changing multiplier applied to a reference clock signal $T_{ax}$.

Referring to FIG. 5B, the PVT information mapping unit 350 of FIG. 4 may include a second mapping table MAP2 storing DQS timing information and mapping information between various levels of the control voltage $V_{CONT}$ and output timing control value for the control voltage $V_{CONT}$. The second mapping table MAP2 may store a second reference value REF2 obtained using a design tool (e.g., P-SPICE) and may store various level control values for the control voltage $V_{CONT}$ as well as output timing control values according to a phase difference between the data signal DQ and the data strobe signal DQS.

Hereinafter, a method of adjusting a control voltage $V_{CONT}$ in response to PVT information using a voltage controller like the ones described in relation to FIGS. 2 and 4 will be described with reference to FIGS. 1, 2, 3, 4, 5A and 5B in some additional detail.

Figure 6B:
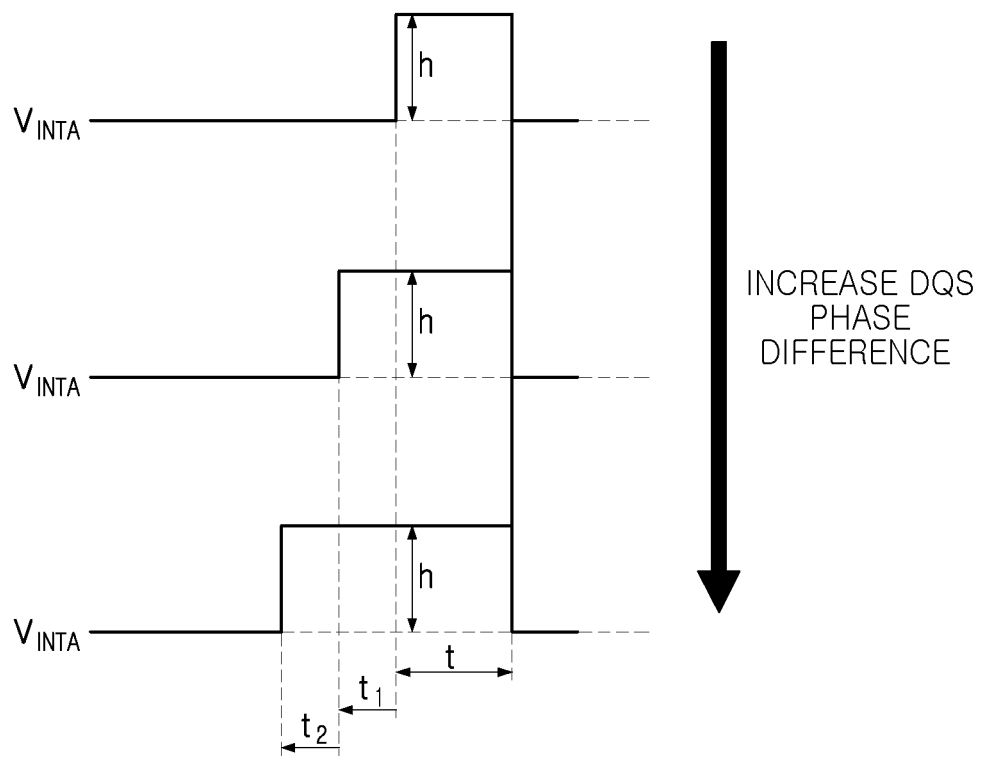
Figure 6C:
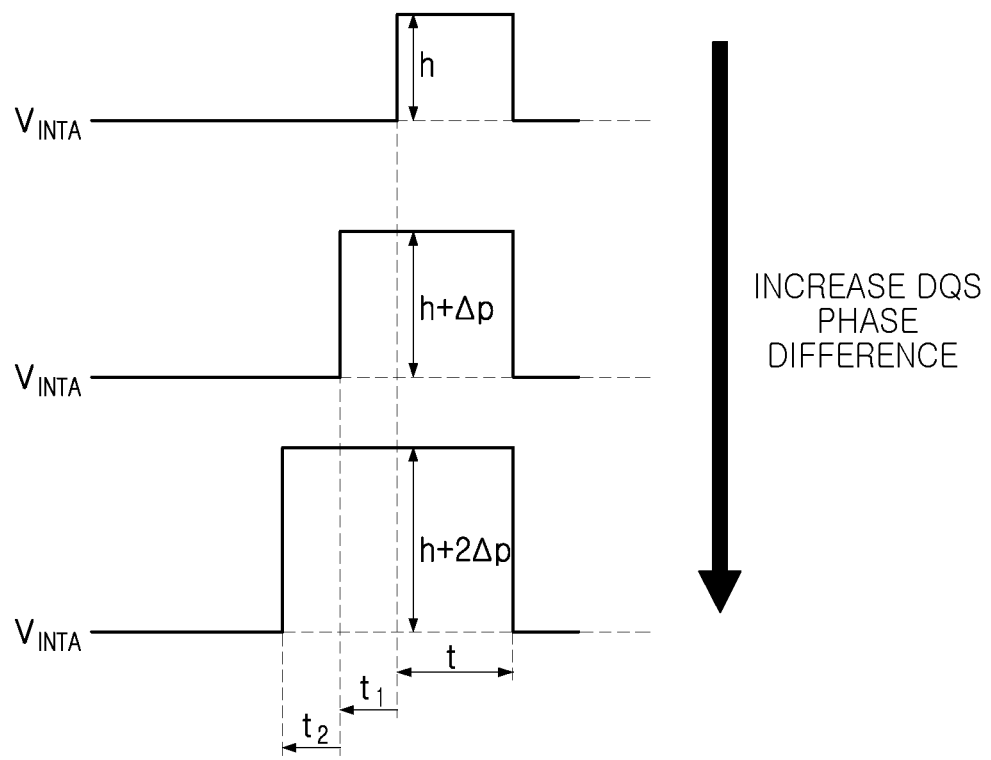

FIGS. 6A, 6B and 6C are respective signal waveforms illustrating in various examples a method of adjusting a control voltage $V_{CONT}$ in response to PVT information using the voltage controller 300 of FIG. 4. FIG. 6A illustrates a method of adjusting the level of an array voltage $V_{INT}$ in response to DQS timing information. FIG. 6B illustrates a method of adjusting output timing for the memory cell array voltage $V_{INT}$ in response to DQS timing information, and FIG. 6C illustrates a method of adjusting the level of the array voltage $V_{INT}$ and the output timing of the array voltage $V_{INT}$ in response to DQS timing information.

Referring to FIGS. 1, 4 and 6A, when a phase difference between the data signal DQ and the data strobe signal DQS increases, the level of the array voltage $V_{INTA}$ may be drastically reduced at an initial stage of a bitline sensing operation performed by the sense 120 amplifier. In order to avoid this undesirable outcome (e.g., in order to compensate for this effect), the voltage controller 300 may increase by level increments the level of the array voltage $V_{INTA}$, as compared with a reference level 'h' in proportion to the phase difference between the phase of the data signal DQ and the phase of the data strobe signal DQS.

Referring to FIGS. 1, 4 and 6B, when a phase difference between the data signal DQ and the data strobe signal DQS is increases, the time duration over which the array voltage $V_{INTA}$ must be maintained at the level 'h' (that is, a pulse width for the array voltage $V_{INTA}$) also increases, so that the time during which the bitline sensing operation performed by the sense amplifier 120 may also increase. In order to compensate for this effect, the voltage controller 300 may advance output timing (e.g., the time at which the array voltage $V_{INTA}$ is applied to the sense amplifier 120) by timing increments (e.g., t, t1 and t2) in proportion to a phase difference between the data signal DQ and the data strobe signal DQS. As a result, while the sense amplifier 120 performs an actual bitline sensing operation, a timing duration 't' (or 't' plus one or more timing increments) over which the array voltage VINTA is maintained at a level of 'h' is uniform, such time the bitline sensing operation may be stably performed.

Referring to FIGS. 1, 4 and 6C, the voltage controller 300 may adjust both the level of the array voltage $V_{INTA}$, as compared with the reference level 'h', as well as the output timing of the array voltage $V_{INTA}$, as compared with the reference timing 't'. Here, as before in FIGS. 6A and 6B, the level b' of the array voltage $V_{INTA}$ may be incremented, and the duration 't' over which this level is maintained may be incremented in response to changes in the phase difference (Δp) between the phase of the data signal DQ and the phase of the data strobe signal DQS.

As described above, the voltage controller 300 of FIG. 4 may be used to adjust at least one of the level of the array voltage $V_{INTA}$ and/or the output timing in response to PVT information, thereby enabling the stable performance of the bitline sensing operation.

Figure 7:
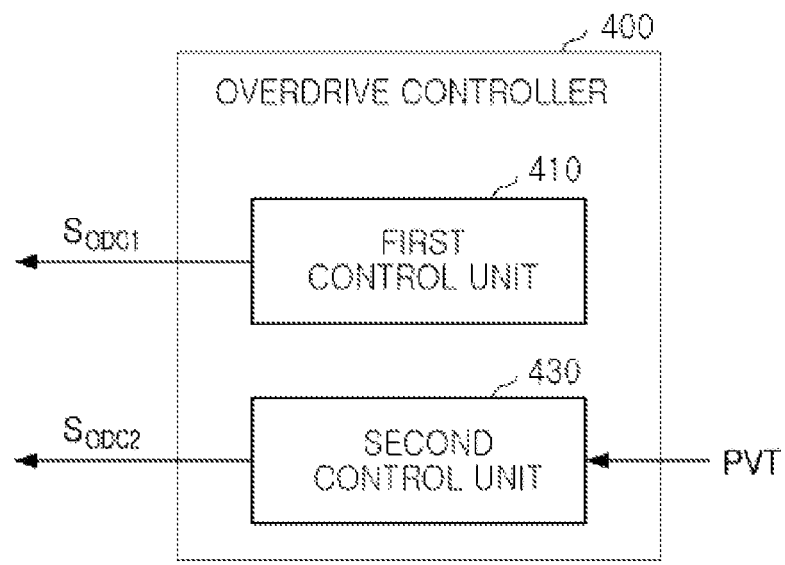
FIG. 7 is a block diagram further illustrating in one example an overdrive controller according to an example embodiment of the inventive concept.

FIG. 7 is a block diagram further illustrating in one example an overdrive controller 400 according to an example embodiment of the inventive concept.

Referring to FIGS. 1 and 7, the overdrive controller 400 may include a first control unit 410 and a second control unit 430.

The first control unit 410 may be used to generate a first overdrive control signal $S_{ODC1}$ for regulating the level of the control voltage $V_{CONT}$ provided by the voltage controller 130. In one approach, the first overdrive control signal $S_{ODC1}$ may be used in conjunction with the feedback control voltage $V_{CONT}$ to ensure that the control voltage $V_{CONT}$ is maintained a level equal to a reference value.

The second control unit 430 may be used to generate a second overdrive control signal $S_{ODC2}$ for regulating at least one of the level of the control voltage $V_{CONT}$ and the output timing of the control voltage $V_{CONT}$ in response to PVT information. In an example embodiment, the PVT information may include a ZQ code and/or DQS timing information. The ZQ code may include a binarized correction value used for a ZQS calibration operation. Moreover, the DQS timing information may include a phase difference between the data signal DQ and the data strobe signal DQS, generated during a write operation of the memory device 10, as described previously with reference to FIGS. 3A and 3B.

The voltage driver (200 or 300) may generate the control voltage $V_{CONT}$ by adjusting at least one of the level and/or the output timing using at least one of the first overdrive control signal $S_{ODC1}$ and/or the second overdrive control signal $S_{ODC2}$ provided by the overdrive controller 400. Here, the voltage driver (200 or 300) may output a second control voltage $V_{CONT2}$ (not shown) to the memory cell array 110 and/or the sense amplifier 120.

Figure 8A:
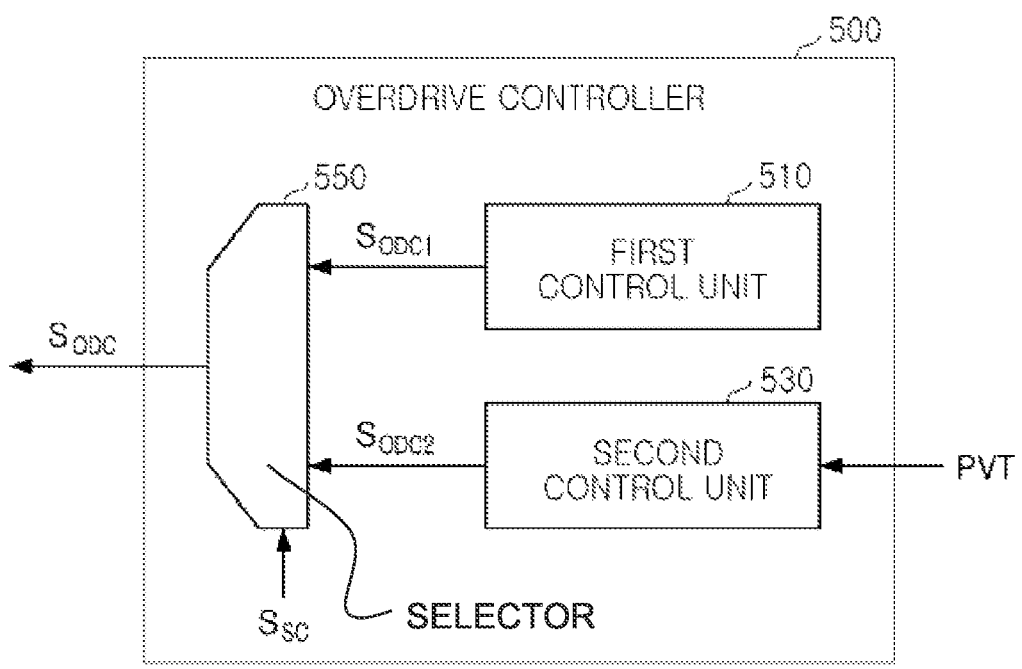
FIG. 8A is a block diagram further illustrating in another example an overdrive controller according to an example embodiment of the inventive concept.
Figure 8B:
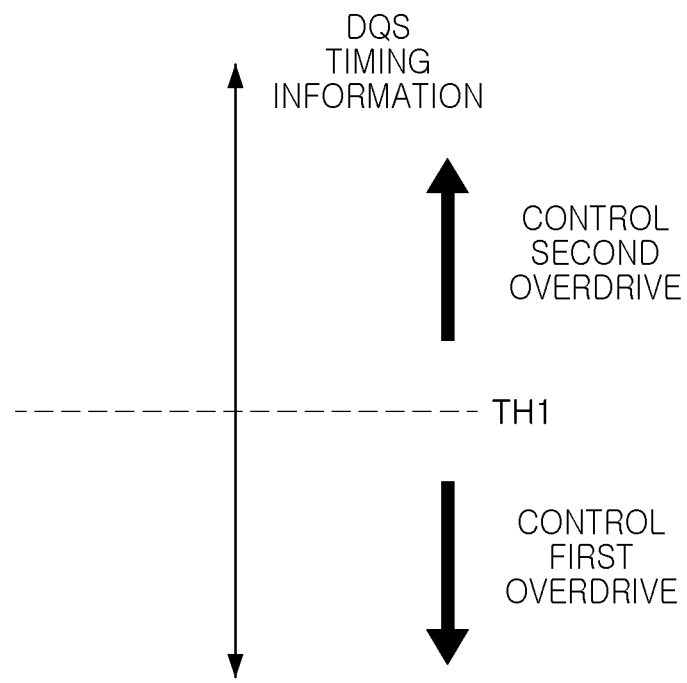
FIGS. 8B and 8C are respective conceptual diagrams illustrating method(s) of operating the overdrive controller of FIG. 8A.
Figure 8C:
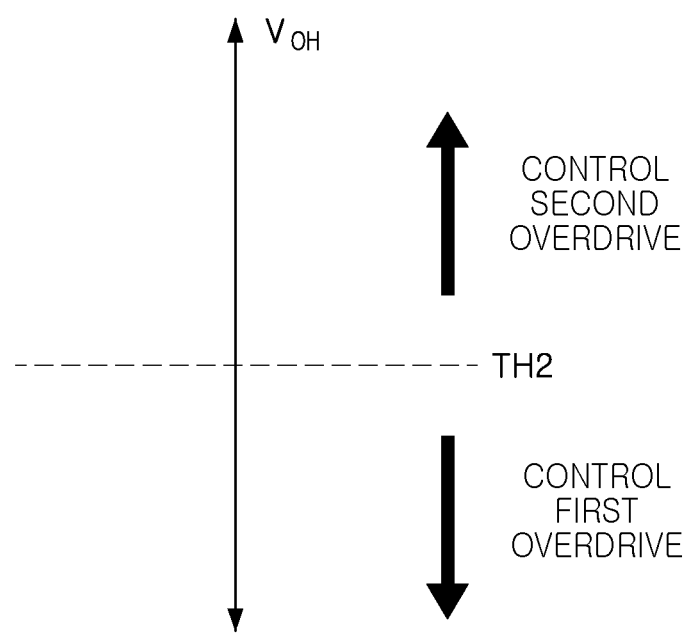

FIG. 8A is a block diagram illustrating in one example an overdrive controller 500 according to an example embodiment of the inventive concept. FIGS. 8B and 8C are respective conceptual diagrams illustrating a method of operating the overdrive controller 400 of FIG. 7.

First, referring to FIGS. 1, 2, 4 and 8A, the overdrive controller 500 may include a first control unit 510, a second control unit 530, and a selector 550, where the first control unit 510 generates the first overdrive control signal $S_{ODC1}$ regulating the level of the control voltage $V_{CONT}$, which may be fed back from the voltage driver (210, 310) of the overdrive controller (230, 330) so that the level remains equal to a reference value.

The second control unit 530 generates the second overdrive control signal $S_{ODC2}$ regulating at least one of the level and/or the output timing of the control voltage $V_{CONT}$ in response to PVT information.

The selector 550 may be used to select between the first overdrive control signal $S_{ODC1}$ and the second overdrive control signal $S_{ODC2}$. The selected one first overdrive control signal $S_{ODC1}$ and the second overdrive control signal $S_{ODC2}$ may then be applied to the voltage driver (210, 310). The selector 550 may be implemented as a multiplexer, but example embodiments of the inventive concept are not limited thereto.

In an example embodiment, the selector 550 may select and output one of first overdrive control signal $S_{ODC1}$ and the second overdrive control signal $S_{ODC2}$ in response to a result comparing DQS timing information with a first threshold TH1. For example, as illustrated in FIG. 8B, when a phase difference between the data signal DQ and the data strobe signal DQS is less than the first threshold TH1 as DQS timing information, it may be determined that the PVT conditions or changes to the PVT conditions are insignificant. In this case, the first overdrive control signal $S_{ODC1}$ may be selected.

In contrast, when the phase difference between the data signal DQ and the data strobe signal DQS is greater than or equal to the first threshold TH1, it may be determined that that PVT conditions or changes to the PVT conditions are significant. In this case, the second overdrive control signal $S_{ODC2}$ may be selected.

In an example embodiment, the selector 550 may select and output one of the first overdrive control signal $S_{ODC1}$ and the second overdrive control signal $S_{ODC2}$ in response to a result of comparing an output high level voltage $V_{OH}$ with a second threshold TH2.

For example, as illustrated in FIG. 8C, when a level of $V_{OH}$ is lower than a second threshold TH2, the PVT conditions may be determined to be insignificant. In this case, the first overdrive control signal $S_{ODC1}$ may be selected and output. On the other hand, when a level of $V_{OH}$ is greater than or equal to a second threshold TH2, the PVT conditions may be determined to be significant. In this case, the second overdrive control signal $S_{ODC2}$ may be selected and output.

In some examples, the first threshold TH1 and the second threshold TH2 may be preset in consideration of various system requirements and data reliability constraints.

As a result of the comparison between DQS timing information and the first threshold TH1, or as a result of the comparison between $V_{OH}$ and the second threshold TH2, a select control signal $S_{SC}$ may be applied to the selector 550. In some examples, when the select control signal $S_{SC}$ is high, the selector 550 may select and output the first overdrive control signal $S_{ODC1}$. Moreover, when the select control signal $S_{SC}$ is low, the selector 550 may select and output the second overdrive control signal $S_{ODC2}$.

Figure 9:
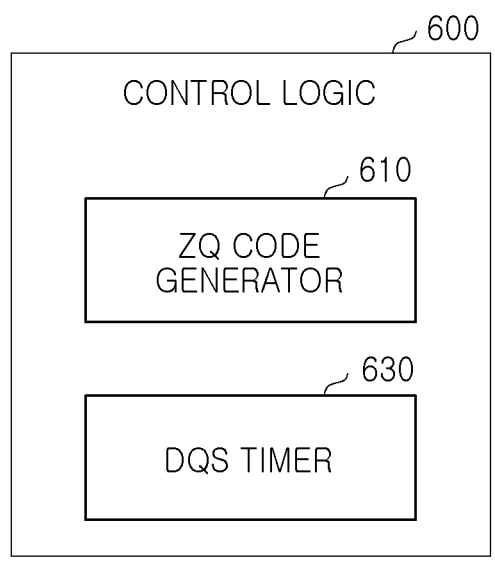
FIG. 9 is a block diagram illustrating in one example control logic for a memory device according to an example embodiment of the inventive concept.

FIG. 9 is a block diagram further illustrating in one example control logic 600 of a memory device according to an example embodiment of the inventive concept.

Referring to FIG. 9, the control logic 600 may be used to generate PVT information, and may also to include a ZQ code generator 610, and/or a DQS timer 630.

The ZQ code generator 610 may be used to generate a binarized correction value for matching ON-resistance of an input and output circuit to ZQ resistance connected to a ZQ pin as a ZQ code. The control logic 600 may perform a ZQ calibration operation for maintaining an output high level voltage $V_{OH}$ constant using a ZQ code. Meanwhile, since the ZQ code is changed in accordance with PVT conditions, where PVT information may be obtained from the ZQ code through a matching process provided by (e.g.) running simulation(s).

The DQS timer 630 may be used to generate a phase difference between a data signal DQ and a data strobe signal DQS as DQS timing information. For example, the DQS timer 630 may operate an internal oscillator for a certain counting time to count the number of clocks of an oscillation signal. The DQS timer 630 may calculate a clock period of an oscillation signal using the counting time and the number of clocks during the counting time, and may obtain ½ of the calculated clock period as a phase difference between a data signal DQ and a data strobe signal DQS. Meanwhile, since the DQS timing information is changed in accordance with the PVT conditions, where PVT information may be obtained from the DQS timing information through a matching process provided (e.g.) by running simulation(s).

Figure 10:
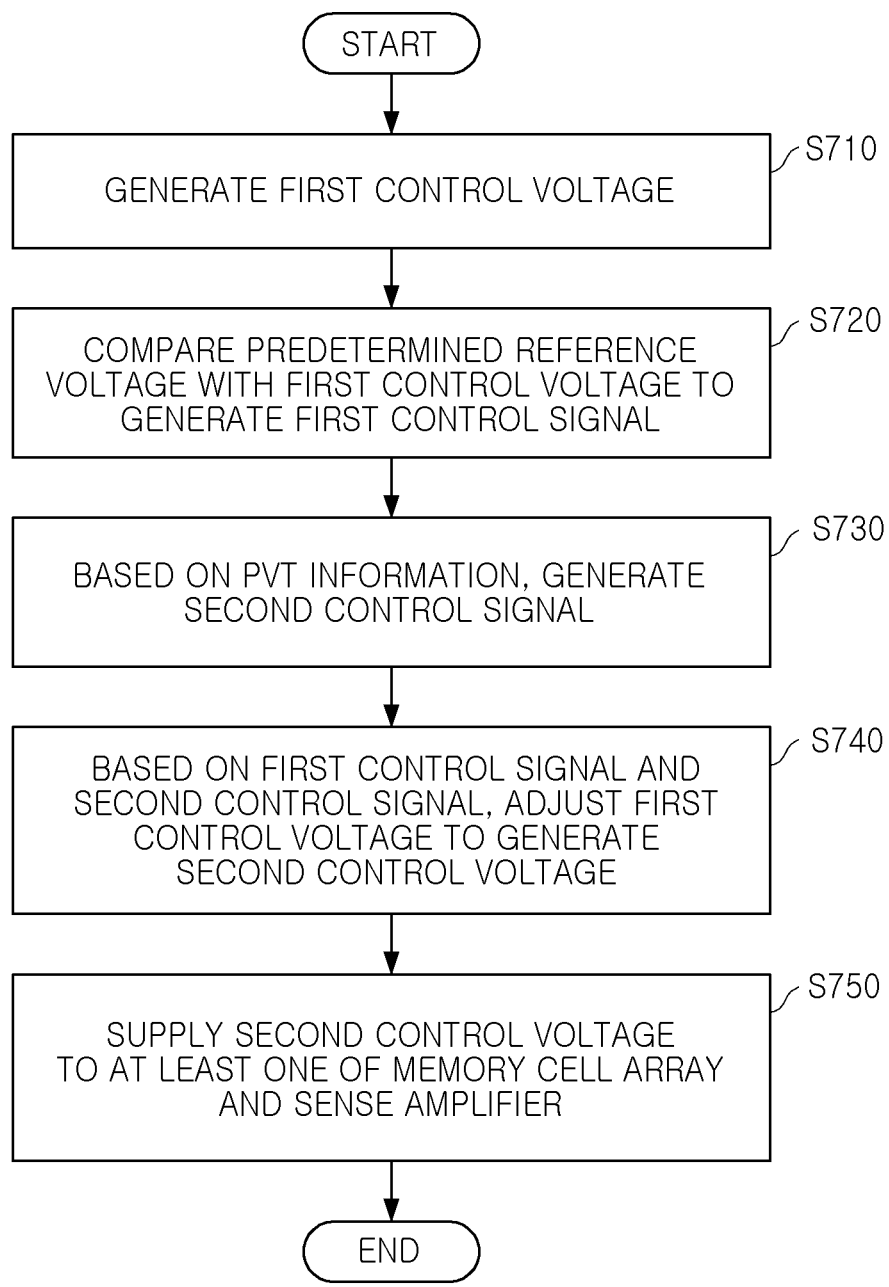
FIGS. 10 and 11 are respective flow diagrams summarizing method(s) of generating control voltage(s) in response to PVT information in a memory device according to an example embodiment of the inventive concept.
Figure 11:
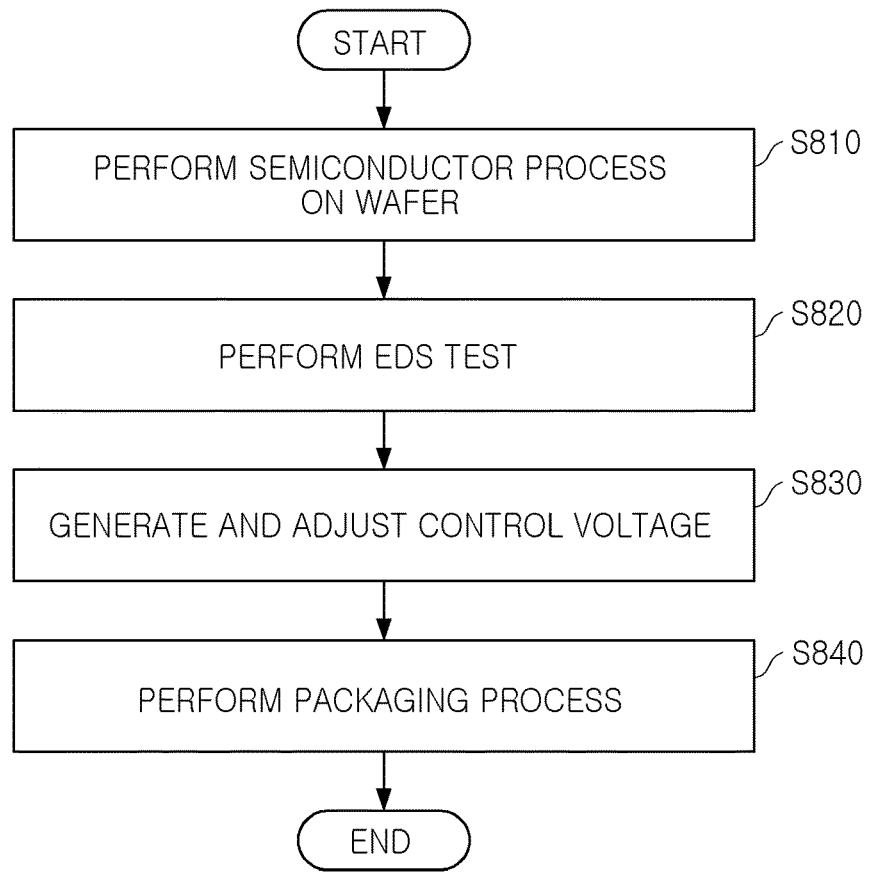

FIGS. 10 and 11 are respective flow diagrams summarizing methods of generating control voltages in response to PVT information using a voltage controller of a memory device according to an example embodiment of the inventive concept.

Referring to FIGS. 2 and 10, the voltage driver 210 may be used to generate the first control voltage $V_{CONT1}$ required for operation of a memory device under the control of a control logic (S710). The first control voltage $V_{CONT1}$ generated by the voltage driver 210 may be fed back to the overdrive controller 230 as a first feedback control voltage.

The overdrive controller 230 may than compare the first feedback control voltage with a reference voltage, and generate a first overdrive control signal $S_{ODC1}$ regulating the level of the first control voltage $V_{CONT1}$ (S720).

The overdrive controller 230 may also be used to generate the second overdrive control signal $S_{ODC2}$ regulating at least one of the level and the output timing of the first control voltage $V_{CONT1}$ in response to the PVT information (S730). In an example embodiment, the PVT information may include a ZQ code for matching ON-resistance Ron of the input and output circuit 122 to ZQ resistance. Moreover, the PVT information may include DQS timing information indicating a phase difference between the data signal DQ and the data strobe signal DQS.

The voltage driver 210 may be used to adjust the first control voltage $V_{CONT1}$ in response to the first overdrive control signal $S_{ODC1}$ and the second overdrive control signal $S_{ODC2}$ received from the overdrive controller 230 in order to generate a second control voltage $V_{CONT2}$ (S740).

In addition, the voltage driver 210 may output the generated second control voltage $V_{CONT2}$ to the memory cell array 110 and/or the sense amplifier 120 (S750). In an example embodiment, the first control voltage $V_{CONT1}$ and the second control voltage $V_{CONT2}$ may be an array voltage $V_{INTA}$ used to perform a bitline sensing operation by the sense amplifier 120.

The control voltage generating method described above with reference to FIG. 10 may be performed during an electrical die sort (EDS) test of the type routinely used to test/inspect the electrical characteristics of a memory device before packaging of the memory device, as illustrated in FIG. 11.

Referring to FIG. 11, certain semiconductor process(es) integral to the manufacturing of a memory device may be performed on a wafer (S810). The wafer may include a plurality of chip regions in which a plurality of memory devices are formed, a scribing region for separating the plurality of chip regions, and the like.

Once the semiconductor process(es) are complete, and the fab out for the wafer is in progress, data may be stored in fuse cells using a memory controller. Then, an Electrical Die Sorting (EDS) test of the wafer may be performed (S820). The EDS test may be performed multiple times at different temperatures. While the EDS test is performed, customizing data for securing a performance of a memory device may be changed. The memory controller may change the data stored in the fuse cells to change customizing data during the performing of the EDS test.

While the EDS test is in progress, a voltage controller like the voltage controllers described above may be used to generate one or more control voltage(s) required for various operation(s) of a memory device. Generation of these control voltage(s) may be performed in response to PVT information (S830). For example, a method of generating the control voltage(s) using a voltage controller as described with reference to FIG. 10 may be performed.

Once the EDS test is complete, the memory controller may migrate data stored in the fuse cells to other cells. Then, a packaging process may performed (S840).

Figure 12:
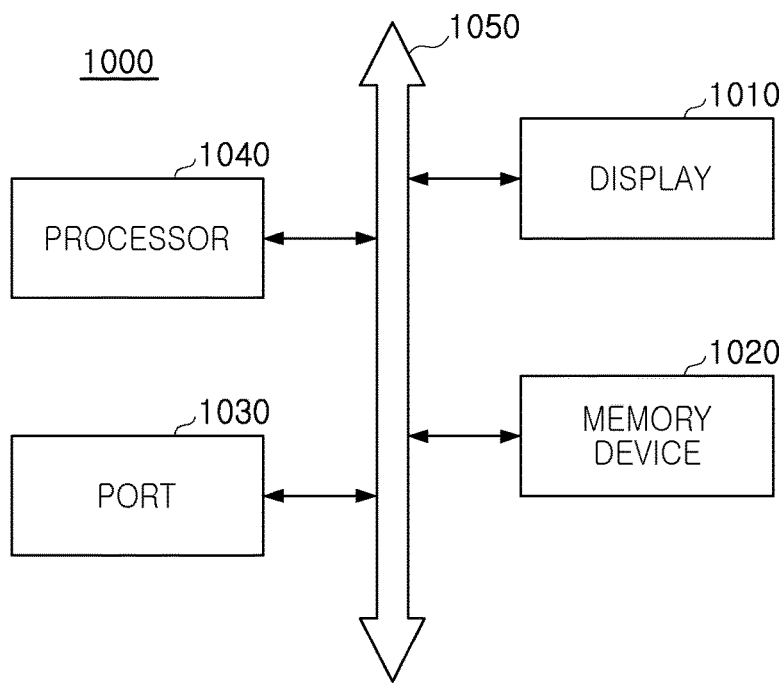
FIG. 12 is a block diagram illustrating a computing device including a memory device according to an example embodiment of the inventive concept.

FIG. 12 is a general block diagram illustrating a computing device 1000 including a memory device according to an example embodiment of the inventive concept.

The computing device 1000 of FIG. 12 may include a display 1010, a memory device 1020, a port 1030, and a processor 1040 among other components. The computing device 1000 may further include a wire/wireless communications device, a power supply, and the like. Among components illustrated in FIG. 12, the port 1030 may be provided for the computing device 1000 to communicate with a video card, a sound card, a memory card, a universal serial bus (USB) device, and the like. The computing device 1000 may be a concept including a smartphone, a tablet PC, a smart wearable device, and the like, as well as a desktop computer and a laptop computer according to the related art.

The processor 1040 may perform a certain operation, a command, a task, and the like. The processor 1040 may be a central processing unit (CPU), a microprocessor unit (MCU), a System on Chip (SoC), or the like, and may communicate with the display 1010, the memory device 1020, and other devices connected to the port 1030, through a bus 1050.

The memory device 1020 may be a storage medium storing data necessary for an operation of the computing device 1000, or multimedia data. The memory device 1020 may include a storage device based on a semiconductor element. For example, the memory device 1020 may include a dynamic random access memory device such as a DRAM, Synchronous DRAM (SDRAM), Double Data Rate SDRAM (DDR SDRAM), Low Power Double Data Rate SDRAM (LPDDR SDRAM), Graphics Double Data Rate SDRAM (GDDR SDRAM), DDR2 SDRAM, DDR3 SDRAM, DDR4 SDRAM, or the like, or a resistive memory device such as a Phase change Random Access Memory (PRAM), a Magnetic Random Access Memory (MRAM), a Resistive Random Access Memory (RRAM), or the like.

In addition, the memory device 1020 may include at least one of a solid state drive (SSD), a hard disk drive (HDD), and an optical disk drive (ODD), as a storage device.

In an example embodiment, the memory device 1020 may include memory devices according to various example embodiments previously described with reference to FIGS. 1 through 11, inclusive.

As described above, according to example embodiments of the inventive concept, a memory device may adjust one or more control voltage(s) required for an operation of the memory device in accordance with PVT information in order to perform the operation more stably.

Moreover, a memory device according to example embodiments of the inventive concept may control one or more control voltage(s) more accurately using PVT information, thereby preventing the over-shoot or the under-shoot of control voltage level(s).

Moreover, a memory device according to example embodiments of the inventive concept may more accurately control an overdrive operation for an internal array voltage using PVT information, thereby maintaining a constant bitline sensing condition.

While example embodiments have been shown and described above, it will be apparent to those skilled in the art that modifications and variations could be made without departing from the scope of the inventive concept, as defined by the appended claims.

What is claimed is:

1. A memory device, comprising:
a memory cell array including a plurality of memory cells storing data, a sense amplifier connected to the memory cell array, and a voltage controller,
wherein the voltage controller includes:
a voltage driver that generates a control signal; and
an overdrive controller that generates an overdrive control signal that regulates generation of the control signal in response to at least one of a result of a comparison between the control signal and a reference voltage, and process, voltage, temperature (PVT) information,
wherein the voltage driver adjusts the control signal in response to the overdrive control signal to generate an overdriven control signal and outputs the overdriven control signal to the sense amplifier.

2. The memory device of claim 1, wherein the control signal is an array voltage, and the voltage driver adjusts a level of the array voltage to generate an overdriven array voltage.

3. The memory device of claim 1, wherein the control signal is an array voltage, and wherein the voltage driver adjusts timing of the array voltage as output to the sense amplifier in order to generate the overdriven array voltage.

4. The memory device of claim 1, wherein the PVT information is obtained during an electrical die sort (EDS) test process that tests electrical characteristics of the memory device before packaging of the memory device.

5. The memory device of claim 1, further including an input and output circuit, wherein the PVT information includes a ZQ code that matches an ON-resistance of the input and output circuit to a predetermined ZQ resistance.

6. The memory device of claim 1, further including an input and output circuit, wherein the PVT information includes a phase difference between a data signal (DQ) and a data strobe signal (DQS), as applied to the input and output circuit.

7. The memory device of claim 1, wherein the control signal is an array voltage, and wherein the voltage controller further includes a PVT information mapping unit that stores mapping information between the PVT information and at least one control value for the array voltage.

8. A memory device, comprising:
a plurality of memory cells disposed at intersections of a plurality of word lines and a plurality of bitlines;
a sense amplifier connected to the plurality of bitlines and sense amplifying data stored in the plurality of memory cells;
an input and output circuit exchanging the data through a plurality of data lines using a data signal (DQ) and a data strobe signal (DQS); and
a voltage controller providing a control voltage to at least one of the plurality of memory cells and the sense amplifier,
wherein the voltage controller includes:
a voltage driver that generates the control voltage;
a first overdrive controller that generates a first overdrive control signal applied to the voltage controller to regulate generation of the control voltage in response to a change in an externally provided power supply voltage; and
a second overdrive controller that generates a second overdrive control signal applied to the voltage driver to regulate generation of the control voltage in response to at least one of a ZQ code that matches an ON-resistance of the input and output circuit to reference ZQ resistance, and a phase difference between the data signal (DQ) and the data strobe signal (DQS).

9. The memory device of claim 8, further comprising a ZQ code generator that generates the ZQ code.

10. The memory device of claim 8, further comprising a DQS timer that determines the phase difference between the data signal (DQ) and the data strobe signal (DQS).

11. The memory device of claim 8, wherein the voltage controller further includes an selector configured to selectively output one of the first overdrive control signal and the second overdrive control signal.

12. The memory device of claim 11, wherein the selector is further configured to select and output one of the first overdrive control signal and the second overdrive control signal in response to result of comparing a phase difference between the data signal (DQ) and the data strobe signal (DQS) with a first threshold.

13. The memory device of claim 12, wherein the selector is configured to select and output the first overdrive control signal when the phase difference between the data signal (DQ) and the data strobe signal (DQS) is less than the first threshold.

14. The memory device of claim 12, wherein the selector is configured to select and output the second overdrive control signal when the phase difference between the data signal (DQ) and the data strobe signal (DQS) is greater than or equal to the first threshold.

15. The memory device of claim 11, wherein the voltage driver is configured to adjust a level of the control voltage in response to the first overdrive control signal.

16. The memory device of claim 11, wherein the voltage driver is configured to adjust at least one of a level and timing of the control voltage in response to the second overdrive control signal.

17. A voltage controller, comprising:
a voltage driver configured to generate a control signal used to perform a bitline sensing operation of a memory device;
a first overdrive controller configured to generate a first overdrive control signal that regulates generation of the control signal by the voltage driver in response to a result of comparing the control signal with a reference voltage; and
a second overdrive controller configured to generate a second overdrive control signal that regulate generation of the control signal by the voltage driver in response to process, voltage, temperature (PVT) information,
wherein the PVT information includes at least one of a ZQ code that matches an ON-resistance of an input and output circuit of the memory device to a reference ZQ resistance, and a phase difference between a data signal (DQ) and a data strobe signal (DQS) as applied to the input and output circuit.

18. The voltage controller of claim 17, wherein the control signal is an array voltage and the voltage driver is configured to adjust a level of the array voltage in response to the first overdrive control signal.

19. The voltage controller of claim 17, wherein the control signal is an array voltage and the voltage driver is configured to adjust at least one of a level of the array voltage and output timing in response to the second overdrive control signal.

20. The voltage controller of claim 17, wherein the control signal is an array voltage, and
the voltage controlled further comprising a PVT information mapping unit that stores mapping information between the PVT information and at least one control value of the array voltage.

* * * * *